United States Patent
Chen et al.

(10) Patent No.: US 6,583,039 B2
(45) Date of Patent: Jun. 24, 2003

(54) METHOD OF FORMING A BUMP ON A COPPER PAD

(75) Inventors: Yen-Ming Chen, Hsin-Chu (TW); Kuo-Wei Lin, Hsin-Chu (TW); Cheng-Yu Chu, Hsinchu (TW); Yang-Tung Fan, Jubei (TW); Fu-Jier Fan, Jubei (TW); Shih-Jane Lin, Hsinchu (TW); Chiou-Shian Peng, Hsinchu (TW); Hsien-Tsung Liu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/978,422

(22) Filed: Oct. 15, 2001

(65) Prior Publication Data

US 2003/0073300 A1 Apr. 17, 2003

(51) Int. Cl.$^7$ .............................................. H01L 21/44

(52) U.S. Cl. .................. 438/612; 438/613; 438/614; 438/615

(58) Field of Search ................... 438/612–617

(56) References Cited

U.S. PATENT DOCUMENTS

| | | | | |
|---|---|---|---|---|
| 5,946,590 | A | * | 8/1999 | Satoh |
| 6,156,648 | A | * | 12/2000 | Huang |
| 6,204,165 | B1 | * | 3/2001 | Ghoshal |
| 6,426,281 | B1 | * | 7/2002 | Lin et al. |

* cited by examiner

Primary Examiner—Ha Tran Nguyen
(74) Attorney, Agent, or Firm—Tung & Associates

(57) ABSTRACT

A method of forming a bump overlying the copper based contact pad to prevent oxidation of the copper based contact pad. A passivation blanket is deposited over a semiconductor device having a copper based contact pad, the passivation blanket includes a first layer overlying the top surface; a second layer overlying the first layer; a portion of the second layer overlying the copper based contact pad is removed leaving the first layer in place; depositing an under bump metallurgy over the semiconductor device, a portion of the first layer overlying the copper based contact pad is removed so that the copper based contact pad has limited exposure to oxygen; depositing an under bump metallurgy over the semiconductor device; removing excess under bump metallurgy; depositing an electrically conductive material over the under bump metallurgy; reflowing electrically conductive material to form a bump overlying the copper based contact pad.

18 Claims, 4 Drawing Sheets

METHOD OF FORMING A BUMP ON A COPPER PAD

FIELD OF THE INVENTION

This invention relates to method of forming a bump on a semiconductor substrate such as a semiconductor wafer, and more particularly to a method of forming an electrically conductive bump on a copper pad of a semiconductor substrate.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach," because the chip is directly attached to the substrate, board, or carrier by the conductive bumps.

The use of flip chip packaging has dramatically grown as a result of the flip chips advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

In fabrication a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In the evaporation method, a wafer is first passivated with an insulating layer, via holes are then etched through the wafer passivation layer which is normally $SiO_2$ to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350 degrees Celsius to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflown into a furnace reflow process. The photolithography/electroplating technique is a simpler technique than evaporation and is less expensive because only a single masking operation is required. However, electroplating requires the deposition of a thick and uniform solder over a hole wafer area and etching metal layers on the wafer without damaging the plated solder layer. The technique of electroless plating may also be used to form UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. After the coating of a photoresist layer and the patterning of the layer, the UBM layers are etched followed by stripping off the photoresist layer. A stencil is then aligned on the wafer and solder paste is squeegeed through the stencil to fill the openings on top of the bond pads and the UBM layers. After the stencil is removed, the solder bumps may be reflown into a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modem IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

FIGS. 1A–G illustrate a prior art method of forming a bump on a semiconductor wafer. As shown in FIG. 1A, typically a semiconductor wafer 10 is provided having a passivation layer 12 formed on the top of the semiconductor wafer. Openings 14 are provided in the passivation layer to expose an aluminum contact pad 16. An oxide layer forms on the upper surface of the aluminum contact pad 16 when the wafer is exposed to air. With aluminum however, the oxide layer protects the aluminum contact pad from further oxidation. Just prior to starting a process of forming a bump on a wafer, the wafer is sputter cleaned to remove the oxide layer on the aluminum contact pad 16. As shown in FIG. 1B, thereafter, an under bump metallurgy (UBM) 18 is deposited across the entire wafer. A preferred method of depositing a UBM is by sputtering. A photoresist 20 is deposited over the wafer, selectively developed and patterned to provide an opening 22 down to the UBM 18 overlying the aluminum contact pad 16 and shown in FIG. 1C. Thereafter, an electrically conductive material 24 such as solder is deposited into the opening 22 by any of a variety of methods including electroplating (FIG. 1D). The photoresist 20 is then removed as shown in FIG. 1E. The excess UBM is etched away as shown in FIG. 1F. Thereafter, the solder material 24 is reflown to form a solder ball (bump) 26 on the semiconductor wafer 10 (FIG. 1G).

However, aluminum contact pads with their unique ability to form a protective oxide layer are being used less and less. There is a major transformation taking place in integrated circuit design and fabrication with the introduction of copper interconnect technology. Copper interconnects will replace aluminum metallization with copper to achieve significant benefits in chip performance. There are variety of benefits associated with using copper for integrated circuit interconnect metalization. First, the copper interconnect wiring resistivity reduces from 2.65 micro-ohms cm for aluminum compared to 1.678 microns cm at 20° C. for copper, reducing signal delay and increasing chip speed. The copper interconnects can be made in much narrower lines consuming less power. The narrower lines permit tighter circuitry packaging which means that fewer levels of metal are needed. Copper has superior resistance to electromigration. There are approximately 20–30 percent fewer processing steps using damascene processing of copper.

However, there are number of disadvantages associated with using copper interconnects. First, copper diffuses quickly into oxides and silicon. There is a concern of copper diffusing into the active regions of the silicon (i.e., source/drain/gate region of the transistor) because it will damage the device by creating junction or oxide leakage. Second, copper cannot be easily patterned using regular plasma etching techniques. Copper dry etching does not produce a volatile by-product during the chemical reaction that is necessary for economical dry etching. Finally, copper oxidizes quickly in air at low temperatures (less than 20° C.) and does not form a protective layer to stop further oxidation. The present invention focuses on solution for the oxidation problem associated with using copper interconnects and copper contact bond pads.

SUMMARY OF THE INVENTION

The present invention includes a method of forming a bump overlying a copper based contact pad to prevent oxidation of the copper based contact pad. One embodiment of the invention includes the step of depositing a passivation blanket over a semiconductor device having a copper based contact pad, and wherein the passivation blanket includes a first layer overlying the top surface of the semiconductor device and at least a second layer overlying the first layer. A portion of the second layer overlying the copper based contact pad is removed leaving the first layer in place to prevent oxidation of the copper based contact pad. Immediately prior to depositing an under bump metallurgy over the semiconductor device, a portion of the first layer overlying the copper based contact pad is removed so that the copper based contact pad has limited exposure to oxygen. An under bump metallurgy is deposited over the semiconductor device. Thereafter, excess under bump metallurgy is removed from the semiconductor device leaving the under bump metallurgy overlying the copper based contact pad. An electrically conductive material is deposited over the under bump metallurgy that overlies the copper based contact pad. Finally, the electrically conductive material is reflown to form a bump overlying the copper based contact pad.

In another embodiment of the invention the first layer comprises silicon and nitrogen.

In another embodiment of the invention the first layer comprises silicon nitride.

In another embodiment of the invention, the second layer comprises silicon and oxygen.

In another embodiment of the invention the second layer comprises silicon oxide.

In another embodiment of the invention the passivation blanket further comprises a third layer.

In another embodiment of the invention the third layer comprises silicon and nitrogen.

In another embodiment of the invention the third layer comprises silicon nitride.

In another embodiment of the invention the under bump metallurgy comprises copper and titanium.

In another embodiment of the invention the semiconductor device comprises a semiconductor wafer.

Another embodiment of the present invention includes a method of forming a bump overlying a copper based contact pad to prevent oxidation to the copper based contact pad including the step of depositing a passivation blanket over a semiconductor wafer including a copper based contact pad, and wherein the passivation blanket comprises a first layer including silicon nitride, a second layer overlying the first layer and including silicon dioxide, and a third layer overlying the second layer and including silicon nitride. A photoresist layer is deposited over the passivation blanket, developed and patterned to form an opening overlying the copper based contact pad. The second and third layers of the passivation blanket are selectively etched away leaving the first layer overlying the copper based contact pad to protect the copper based contact pad from oxidation. Immediately prior to depositing an under bump metallurgy over the semiconductor wafer, the first layer of the passivation blanket is removed. Thereafter an under bump metallurgy is deposited over the semiconductor wafer including the copper based contact pad. A solder based material is deposited into the opening overlying the under bump metallurgy and the copper based contact pad. The photoresist layer is removed, and the solder based material reflown to form a bump overlying the copper based contact pad.

Another embodiment of the invention includes a method of forming a bump overlying a copper based contact pad to prevent oxidation the copper based contact pad including the step of providing a semiconductor device having a copper based contact pad and a first passivation blanket overlying the upper surface of the semiconductor device and having an opening formed therein down to the copper based contact pad. A second passivation blanket is deposited over the semiconductor device including over the copper based contact pad. The second passivation blanket is kept in place until immediately prior to depositing an under bump metallurgy over the semiconductor device so that the copper based contact pad is protected from oxidation. A portion of the second passivation blanket over the copper based contact is removed. Immediately thereafter an under bump metallurgy is deposited over the semiconductor device and over the copper based contact pad to prevent oxidation and the copper based contact pad. A photoresist layer is deposited over the semiconductor wafer, selectively developed and patterned to provide an opening down to the under bump metallurgy overlying the copper days contact pad. An electrically conductive material is deposited into the opening overlying the under bump metallurgy and the copper based contact pad. The photoresist layer is removed and the electrically conductive material is reflown to form a bump overlying the copper based contact pad.

In another embodiment of the present invention, and the first passivation blanket comprises a first layer including silicon and nitride, and a second layer including silicon and oxygen.

In another embodiment of the invention, the second passivation blanket comprises a third layer overlying the first passivation blanket, and wherein the third layer comprises silicon and nitrogen.

In another embodiment of the invention the step of removing a portion of the second passivation blanket overlying the copper based contact pad comprises etching a portion of the second passivation blanket.

In another embodiment of the invention, the step of removing a portion of the second passivation blanket overlying the copper based contact pad comprises ion milling.

In another embodiment of the invention the electrically conductive material comprises solder.

In another embodiment of the invention the under bump metallurgy comprises copper.

In another embodiment of the invention the under bump metallurgy comprises copper and titanium.

In another embodiment of the invention the step of depositing an under bump metallurgy comprises sputtering copper and titanium onto the copper based contact pad.

DETAILED DESCRIPTION OF THE PREFERRED EMBODIMENTS

Figure 1A:
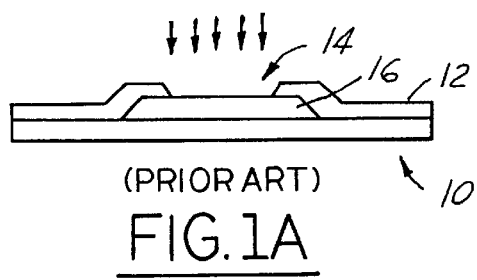
FIG. 1A illustrates the step of sputter cleaning the top surface of a wafer to remove an oxide layer formed on the top of an aluminum contact pad in a prior art process of forming a bump on a semiconductor wafer.
Figure 1B:
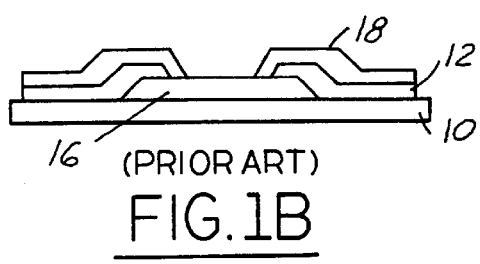
FIG. 1B illustrates the step of sputtering a UBM layer across a semiconductor wafer in a prior art process of forming a bump on a semiconductor wafer.
Figure 1C:
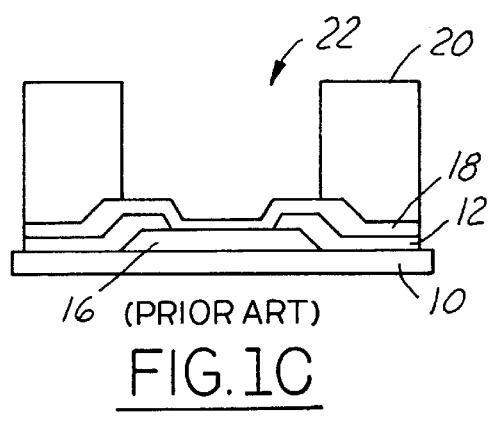
FIG. 1C illustrates the step of depositing a photoresist layer, and selectively developing and patterning the photoresist to provide an opening over the contact pad in a prior art process of forming a bump on a semiconductor wafer.
Figure 1D:
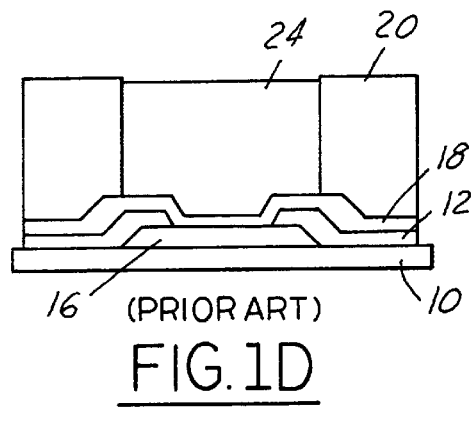
FIG. 1D illustrates the step of electroplating a solder material over the UBM and contact pad in a prior art process of forming a bump on a semiconductor wafer.
Figure 1E:
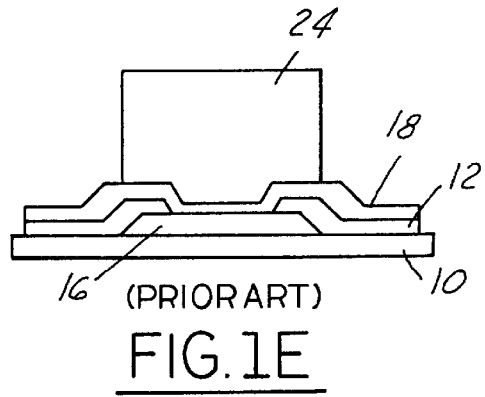
FIG. 1E illustrates the step of removing the photoresist in a prior art process of forming a bump on a semiconductor wafer.
Figure 1F:
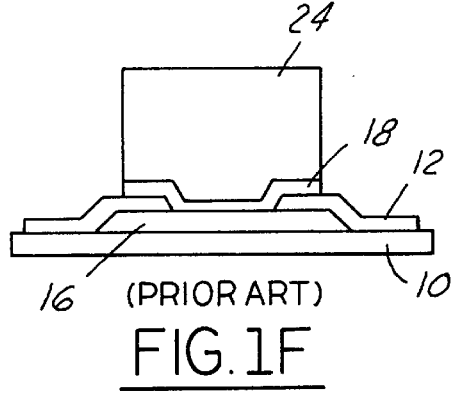
FIG. 1F illustrates the step of etching the excess portion of UBM layer in a prior art process of forming a bump on a semiconductor wafer.
Figure 1G:
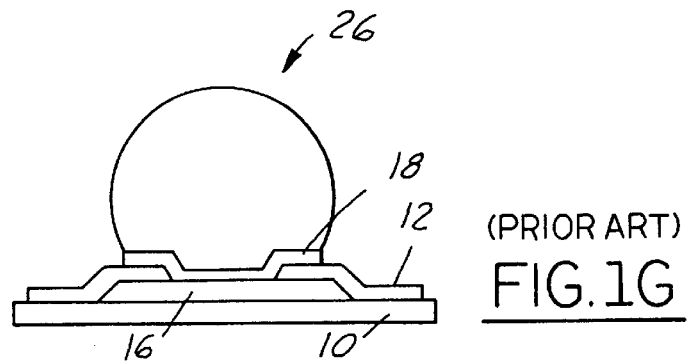
FIG. 1G illustrates the step of reflowing the solder material to form a solder ball in a prior process of forming a bump on a semiconductor wafer.
Figure 2A:
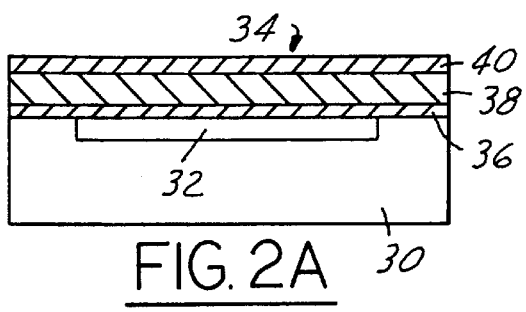
FIG. 2A illustrates a step of depositing a multilayer passivation blanket over a semiconductor wafer having a contact pad comprising copper according to the present invention.
Figure 2B:
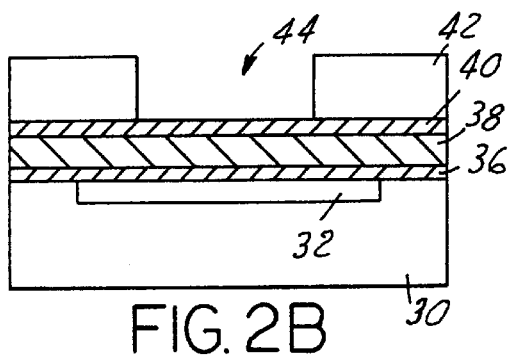
FIG. 2B illustrates the steps of depositing, developing and patterning a photoresist layer over the passivation blanket of FIG. 2A according to the present invention.
Figure 2C:
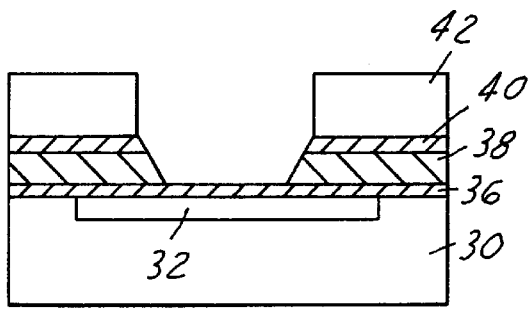
FIG. 2C illustrates the step of removing the top layers of the passivation blanket leaving a first layer covering the contact pad comprising copper according to the present invention.
Figure 2D:
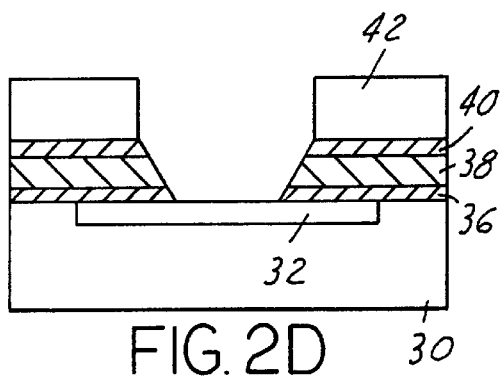
FIG. 2D illustrates the step of removing the first layer of the passivation blanket immediately prior to depositing an under bump metallurgy according to the present invention.
Figure 2E:
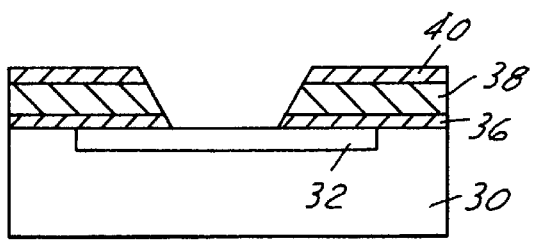
FIG. 2E illustrates the step of removing the photoresist layer according to the present invention.

FIGS. 2A–K illustrate the steps of one embodiment of a method of forming a bump on a copper based contact pad according to the present invention. As shown in FIG. 2A, a semiconductor device 30 is provided having a copper based contact pad 32 formed thereon. The term copper based contact pad as used herein means a contact pad made from pure copper, copper alloys, and/or a combination of copper and other metals or materials. A passivation blanket 34 is deposited over the semiconductor wafer 30. The passivation blanket 34 preferably includes a plurality of layers. A first layer 36 which preferably is a silicon nitride layer. A second layer 38 is deposited which preferably is a silicon oxide layer. A third layer 40 is deposited which preferably also is a silicon nitride layer. As shown in FIG. 2B, a photoresist layer 42 is deposited over the passivation blanket 34, and developed and patterned to form an opening 44 overlying the contact pad 32. Portions of the second and third layers 38, 40 are removed, for example, by dry etching and the first layer 36 of the passivation blanket 34 is left covering the copper based contact pad 32 to prevent oxidation of the copper contact pad (as shown in FIG. 2C). Immediately prior to depositing an under bump metallization layer, the first layer 36 of the passivation blanket 34 is removed, by etching for example, (as shown and FIG. 2D), and immediately thereafter the photoresist layer 42 is also removed (FIG. 2E).

Figure 2F:
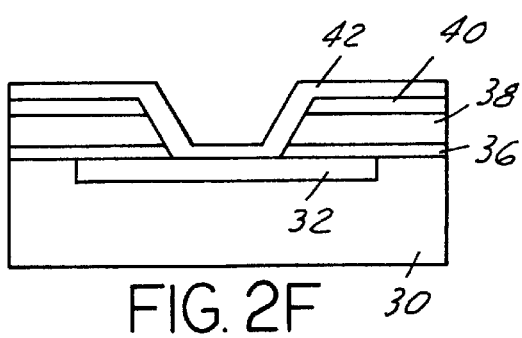
FIG. 2F illustrates the step of depositing an under bump metallurgy over the semiconductor wafer including the contact pad comprising copper.
Figure 2G:
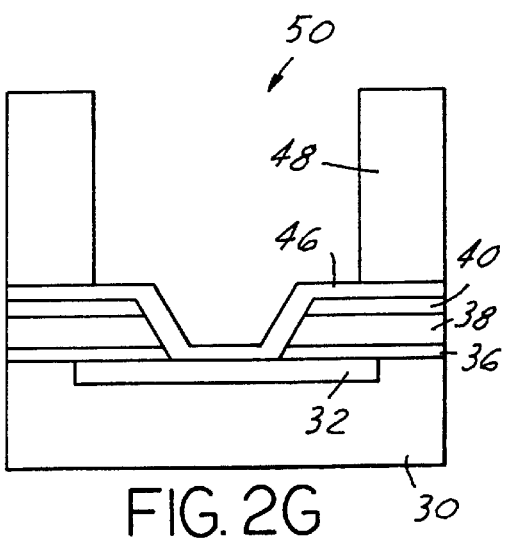
FIG. 2G illustrates the steps of depositing, developing and patterning another photoresist layer to provide a via or opening over the contact pad comprising copper according to the present invention.
Figure 2H:
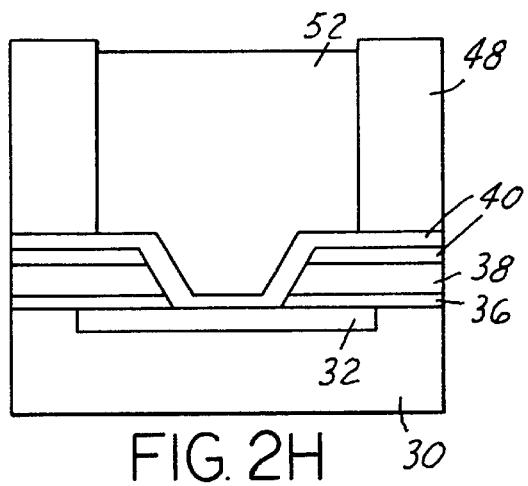
FIG. 2H illustrates the step of depositing an electrically conductive material such as solder into the opening over the contact pad according to the present invention.
Figure 2I:
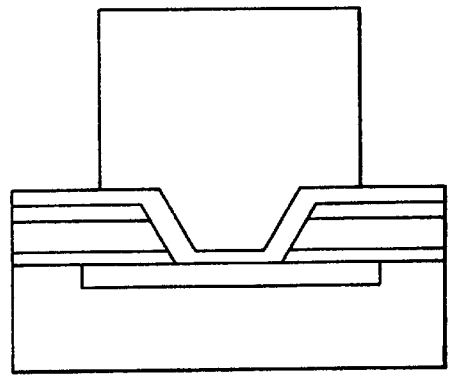
FIG. 2I illustrates the step of removing the second photoresist layer according to the present invention.
Figure 2J:
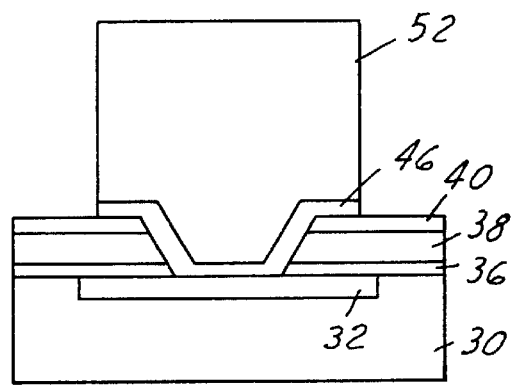
FIG. 2J illustrates the step of removing the excess under bump metallurgy according to the present invention.
Figure 2K:
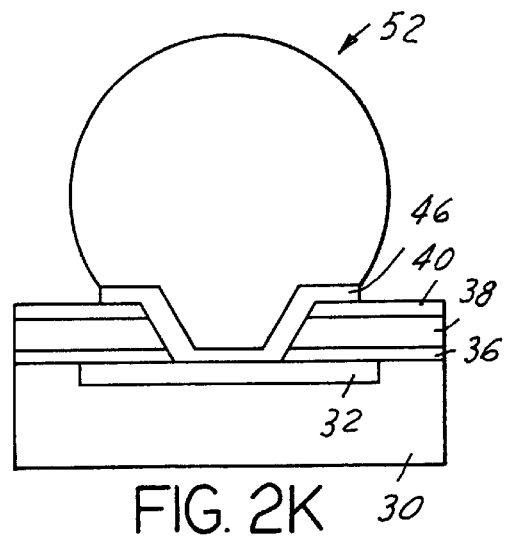
FIG. 2K illustrates a step of reflowing the electrically conductive material (solder) to form a solder ball on the semiconductor wafer.

As shown in FIG. 2F, an under bump metallurgy (UBM) 46 is deposited over the semiconductor wafer, preferably by sputtering. The UBM may comprise any of a variety of materials but for a copper based contact pad 32, preferably the UBM includes layers of copper and titanium. A second photoresist layer 48 is deposited, developed and patterned to provide an opening or via 50 overlying the contact pad 32 (FIG. 2G). Thereafter, an electrically conductive material 52 such as solder is deposited in the opening 50 and onto the UBM 46 overlying the contact pad 32 (FIG. 2H). The photoresist is removed (FIG. 2I), and the excess UBM is removed (FIG. 2J) as well by any of a variety of methods known to those skilled in the art, including etching. Finally, the electrically conductive material 52 is heated to reflow the electrically conductive material 52 and thereafter cooled to form a bump or ball 54 on the semiconductor wafer 30 (FIG. 2K).

Figure 3A:
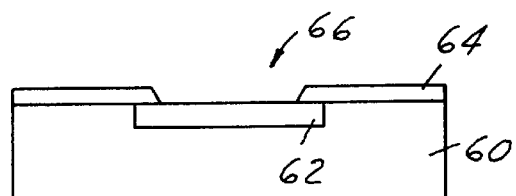
FIG. 3A illustrates the step of providing a semiconductor wafer with a contact pad comprising copper and a first passivation blanket having an opening therein overlying the contact pad according to the present invention.
Figure 3B:
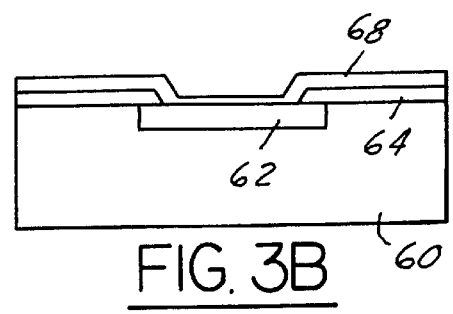
FIG. 3B illustrates a step of depositing a second passivation blanket over the semicoductor wafer and over the contact pad according to the present invention.
Figure 3C:
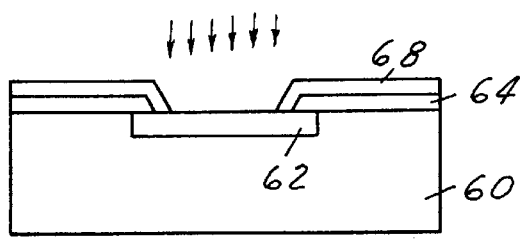
FIG. 3C illustrates the step of removing the second passivation blanket immediately prior to depositing an under bump metallurgy layer according to the present invention.
Figure 3D:
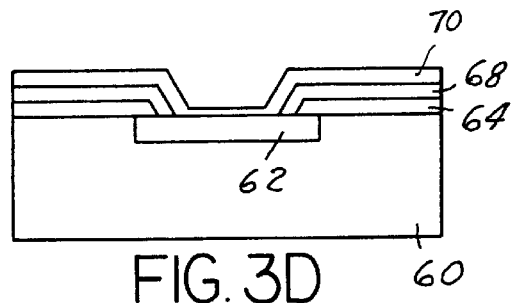
FIG. 3D illustrates a step of depositing a UBM over the semiconductor wafer and over the contact pad according to the present invention.
Figure 3E:
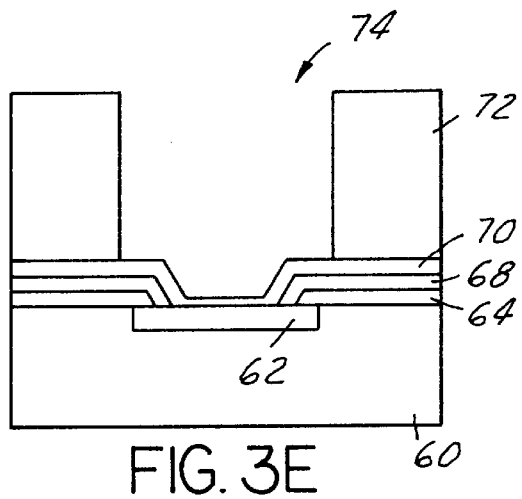
FIG. 3E illustrates the steps of depositing, developing and patterning a photoresist layer to provide an opening over the contact pad according to the present invention.
Figure 3F:
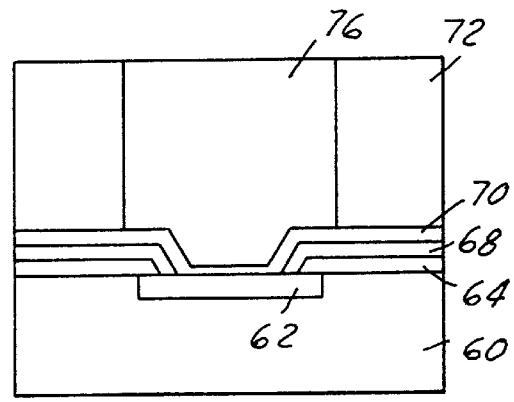
FIG. 3F illustrates the step of depositing electrically conductive material such as copper into the opening in the photoresist overlying the contact pad according to the present invention.
Figure 3G:
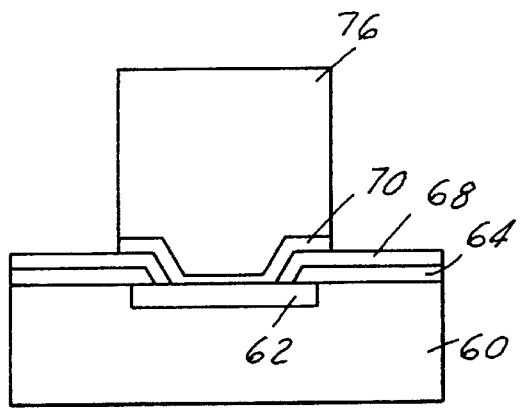
FIG. 3G illustrates the steps of removing the photoresist layer and removing the excess UBM according to the present invention.
Figure 3H:
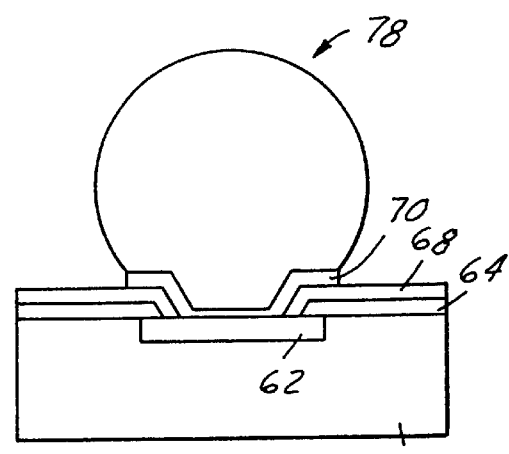
FIG. 3H illustrates a step of reflowing the electrically conductive material (solder) to form a solder ball on the semiconductor wafer according to the present invention.

FIGS. 3A–H illustrate the steps in another embodiment of a method of forming a bump on a copper based contact pad according to the present invention. FIG. 3A illustrates the step of providing a semiconductor wafer 16 having a copper based contact pad 62 formed thereon. A first passivation blanket 64 is provided over the semiconductor wafer 60 and an opening 66 is provided in the first passivation layer 64 overlying the copper based contact pad 62. This first passivation blanket 64 may be a single layer of material or may be a plurality of layers including a first layer comprising silicon oxide overlying the semiconductor wafer 60 and a second layer comprising silicon nitride overlying the first layer. As shown in FIG. 3B, a second passivation blanket 68 is deposited over the semiconductor wafer 60 and over the copper based contact pad 62. The second passivation blanket 68 covers the copper based contact pad 62 to prevent further oxidation of the copper based contact pad. Preferably the second passivation blanket 68 is a single layer of silicon nitride. The second passivation blanket 68 remains in place until a time immediately prior to depositing an under bump metallurgy (UBM) over the copper based contact pad. In this embodiment of the invention, a portion of the second passivation blanket 68 over the contact pad 62 is removed preferably by in-situ iron milling (FIG. 3C). Immediately thereafter, a UBM 70 is deposited (as shown in FIG. 3D) over the semiconductor wafer 36 preferably by sputtering. Again, the UBM 70 can comprise a variety of materials but for a copper based contact pad preferably includes layers of copper and titanium. As shown in FIG. 3E, a photoresist layer 32 is deposited, developed and patterned to provide an opening 74 overlying the contact pad 62. An electrically conductive material 76 such as solder is deposited into the opening 74 and onto the UBM 70 overlying the contact pad 62 (FIG. 3F). The electrically conductive material 76 may be deposited by any of a variety of methods known to those skilled in the art including plating or printing. FIG. 3G illustrates the steps of removing the photoresist 72 and removing the excess UBM 70 by any of variety of methods including etching. Finally, FIG. 3H illustrates the step of heating the electrically conductive material 76 to reflow the same and to form a bump or ball 78 are the semiconductor wafer 60.

What is claimed is:

1. A method of forming a bump overlying a copper based contact pad to prevent oxidation of the copper based contact pad comprising:

depositing a passivation blanket over a semiconductor device having a copper based contact pad, and wherein the passivation blanket includes a first layer overlying a top surface of the semiconductor device and at least a second layer overlying the first layer;

removing a portion of the second layer overlying the copper based contact pad leaving the first layer in place to prevent oxidation of the copper based contact pad;

immediately prior to depositing an under bump metallurgy over the semiconductor device, removing a portion of the first layer overlying the copper based contact pad so that the copper based contact pad has limited exposure to oxygen, and wherein the removing of the portion of the first layer overlying the copper based contact pad comprises ion milling the portion of the first layer;

depositing an under bump metallurgy over the semiconductor device, and wherein the depositing of the under bump metallurgy over the semiconductor device comprises sputtering under bump material over the semiconductor device;

removing excess under bump metallurgy from the semiconductor device leaving the under bump metallurgy overlying the copper based contact pad;

depositing an electrically conductive material over the under bump metallurgy that overlies the copper based contact pad; and reflowing the electrically conductive material to form a bump overlying the copper based contact pad.

2. A method as set forth in claim 1 wherein the first layer comprises silicon and nitrogen.

3. A method as set forth in claim 1 wherein the first layer comprises silicon nitride.

4. A method as set forth in claim 1 wherein the second layer comprises silicon and oxygen.

5. A method as set forth in claim 1 wherein the second layer comprises silicon oxide.

6. A method as set forth in claim 1 wherein the passivation blanket further comprises a third layer.

7. A method as set forth in claim 6 wherein the third layer comprises silicon and nitrogen.

8. A method as set forth in claim 6 wherein the third layer comprises silicon nitride.

9. A method as set forth in claim 1 wherein the under bump metallurgy comprises copper and titanium.

10. A method as set forth in claim 1 wherein the semiconductor device comprises a semiconductor wafer.

11. A method of forming a bump overlying a copper based contact pad to prevent oxidation of the copper based contact pad comprising:

depositing a passivation blanket over a semiconductor wafer including a copper based contact pad, and wherein the passivation blanket comprising a first layer including silicon nitride, a second layer overlying the first layer and the second layer including silicon oxide, and a third layer overlying the second layer and the third layer including silicon nitride;

depositing a photoresist layer over the passivation blanket, developing and patterning the photoresist layer to form an opening overlying the copper based contact pad;

selectively etching portions of the second and third layers of the passivation blanket leaving the first layer overlying the copper based contact pad to protect the copper based contact pad from oxidation;

immediately prior to depositing an under bump metallurgy over the semiconductor wafer, removing a portion of the first layer of the passivation blanket overlying the copper based contact pad, and wherein the removing of the portion of the first layer overlying the copper based contact pad comprises ion milling the portion of the first layer;

depositing an under bump metallurgy over the semiconductor wafer including over the copper based contact pad, and wherein the depositing of the under bump metallurgy over the semiconductor device comprises sputtering under bump material over the semiconductor device;

depositing a solder based material over the under bump metallurgy overlying the copper based contact pad;

removing the photoresist layer;

reflowing the solder based material to form a bump overlying the copper based contact pad.

12. A method of forming a bump overlying a copper based contact pad to prevent oxidation of the copper based contact pad comprising:

providing a semiconductor device having a copper based contact pad and a first passivation blanket overlying an upper surface of the semiconductor device and having an opening formed in the first passivation blanket down to the copper based contact pad;

depositing a second passivation blanket over the semiconductor device including over the copper based contact pad;

keeping the second passivation blanket in place until immediately prior to depositing an under bump metallurgy over the semiconductor device so that the copper based contact pad is protected from oxidation;

removing a portion of the second passivation blanket overlying the copper based contact pad, and wherein the removing of the portion of the second passivation blanket overlying the copper based contact pad comprises ion milling the portion of the second passivation blanket;

immediately thereafter depositing an under bump metallurgy over the semiconductor device and over the copper based contact pad to prevent oxidation of the copper based contact pad, and wherein the depositing of the under bump metallurgy over the semiconductor device comprises sputtering under bump material over the semiconductor device;

depositing a photoresist layer over the semiconductor wafer, selectively developing and patterning the photoresist layer to provide an opening down to the under bump metallurgy overlying the copper based contact pad;

depositing an electrically conductive material into the opening overlying in the photoresist layer overlying the copper based contact pad;

removing the photoresist layer; and reflowing the electrically conductive material to form a bump overlying the copper based contact pad.

13. A method as set forth in claim 12 wherein the first passivation blanket comprises a first layer including silicon and nitride, and a second layer including silicon and oxygen.

14. A method as set forth in claim 12 wherein the second passivation blanket comprises a third layer overlying the first passivation blanket, and wherein the third layer comprises silicon and nitrogen.

15. A method as set forth in claim 12 wherein the electrically conductive material comprises solder.

16. A method as set forth in claim 12 wherein the under bump metallurgy comprises copper.

17. A method as set forth in claim 12 wherein the under bump metallurgy comprises copper and titanium.

18. A method as set forth in claim 12 wherein the sputtering of under bump metallurgy material comprises sputtering layers of copper and titanium onto the copper based contact pad.

* * * * *